US008334028B2

(12) United States Patent
Nagata et al.

(10) Patent No.: US 8,334,028 B2
(45) Date of Patent: *Dec. 18, 2012

(54) METHOD OF FORMING A PROTECTIVE FILM

(75) Inventors: Naruhisa Nagata, Nagano (JP); Ryoji Kobayashi, Nagano (JP); Masaki Miyazato, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/644,937

(22) Filed: Dec. 22, 2009

(65) Prior Publication Data

US 2010/0167090 A1 Jul. 1, 2010

(30) Foreign Application Priority Data

Dec. 22, 2008 (JP) .................................. 2008-325922

(51) Int. Cl.
*H05H 1/24* (2006.01)

(52) U.S. Cl. ........ 427/577; 427/533; 427/534; 427/535; 427/130

(58) Field of Classification Search .................. 427/128, 427/130, 131, 132, 577, 533, 534, 535
See application file for complete search history.

(56) References Cited

U.S. PATENT DOCUMENTS

| | | | | |
|---|---|---|---|---|
| 4,816,334 | A | * | 3/1989 | Yokoyama et al. ............ 428/336 |
| 4,996,079 | A | | 2/1991 | Itoh |
| 5,053,246 | A | * | 10/1991 | Shuttleworth et al. ......... 427/538 |
| 5,462,784 | A | * | 10/1995 | Grill et al. .................. 428/835.2 |
| 5,556,707 | A | | 9/1996 | Usuki et al. |
| 5,618,639 | A | * | 4/1997 | Ohno et al. ................ 428/835.8 |
| 5,674,638 | A | * | 10/1997 | Grill et al. .................. 428/835.2 |
| 5,837,357 | A | * | 11/1998 | Matsuo et al. ................. 428/212 |
| 5,981,000 | A | | 11/1999 | Grill et al. |
| 6,066,399 | A | | 5/2000 | Hirano et al. |
| 6,354,008 | B1 | | 3/2002 | Domoto et al. |
| 6,391,419 | B1 | | 5/2002 | Katayama et al. |
| 6,455,101 | B1 | | 9/2002 | Sasaki et al. |
| 6,468,602 | B2 | | 10/2002 | Sakaguchi et al. |
| 6,528,115 | B1 | | 3/2003 | Hirano et al. |
| 6,571,729 | B2 | | 6/2003 | Sasaki et al. |
| 6,613,459 | B1 | | 9/2003 | Saito et al. |
| 6,911,272 | B2 | * | 6/2005 | Katayama .................. 428/832.4 |
| 7,354,629 | B2 | * | 4/2008 | Nagata .......................... 427/525 |
| 2002/0011212 | A1 | | 1/2002 | Ogawa et al. |
| 2002/0021522 | A1 | | 2/2002 | Kondo et al. |
| 2002/0028286 | A1 | | 3/2002 | Sasaki et al. |
| 2002/0028358 | A1 | | 3/2002 | Ishibashi et al. |
| 2002/0034107 | A1 | | 3/2002 | Saito |
| 2002/0064606 | A1 | | 5/2002 | Sakaguchi et al. |
| 2003/0224212 | A1 | * | 12/2003 | Sonoda et al. ............ 428/694 R |
| 2004/0028949 | A1 | * | 2/2004 | Ono et al. ................. 428/694 TS |
| 2004/0157006 | A1 | | 8/2004 | Sato et al. |
| 2005/0153169 | A1 | | 7/2005 | Watanabe et al. |
| 2007/0210324 | A1 | * | 9/2007 | Kawaguchi et al. ............ 257/96 |
| 2008/0310050 | A1 | * | 12/2008 | Osawa et al. .................. 360/110 |
| 2010/0086808 | A1 | * | 4/2010 | Nagata .......................... 428/800 |

FOREIGN PATENT DOCUMENTS

| | | | |
|---|---|---|---|
| JP | 2-91838 | * | 3/1990 |
| JP | 09-040494 A | | 2/1997 |
| JP | 09-128732 A | | 5/1997 |
| JP | 10-053877 A | | 2/1998 |
| JP | 2000268357 A | | 9/2000 |
| JP | 2001-126233 A | | 5/2001 |
| JP | 2003-303410 A | | 10/2003 |
| JP | 2004-280888 A | | 10/2004 |
| JP | 2004-288327 A | | 10/2004 |
| JP | 2005158092 A | | 6/2005 |
| JP | 2007-265586 A | | 10/2007 |
| JP | 2008276898 A | | 11/2008 |
| WO | 9914746 A1 | | 3/1999 |
| WO | 2007114207 A | | 10/2007 |

OTHER PUBLICATIONS

Fung, M.K., et al., "Deposition of ultra-thin diamond-like carbon protective coating on magnetic disks by electron cyclotron resonance plasma technique". Journal of Non-Crystalline Solids 254 (1999) 167-173.*

Sun, Yongjian, et al., "Ultrathin Ion-Beam Carbon as an Overcoat for the Magnetic Recording Medium". IEEE Transactions on Magnetics, vol. 39, No. 1, Jan. 2003, pp. 594-598.*

Yokosawa, Teruhisa, et al., "Reliability of Perpendicular Magnetic Recording Media". Fuji Electric Review, vol. 53 No. 2, pp. 39-42, 2007.*

Japanese Office Action issued Jun. 14, 2011 for corresponding Japanese Application No. 2005-232364.

Office Action issued Jan. 19, 2012 for JP2008-218568 (Partial Translation provided) Cited in related US 2010/0086808.

Japanese Office Action issued corresponding Japanese patent application No. JP2008-325922, dated Jun. 29, 2012. Partial English translation provided.

\* cited by examiner

*Primary Examiner* — Bret Chen

(74) *Attorney, Agent, or Firm* — Rossi, Kimms & McDowell LLP

(57) ABSTRACT

A method of forming a protective film for a magnetic recording medium is disclosed. The protective film suppresses cobalt elution out of the magnetic recording layer and has a thickness not larger than 3 nm. The method of the invention of forming a protective film for a magnetic recording medium comprises (1) a step of forming a protective film, on a lamination including a substrate and metallic film layers formed on the substrate, by means of a plasma CVD method using a raw gas of a hydrocarbon gas, wherein a flow rate of the hydrocarbon gas is in a range of 50 sccm to 200 sccm and a emission current is in a range of 0.1 A to 0.3 A, and (2) a step of surface treatment on the protective film that has been formed in the step (1), including sub-steps of (2a) a plasma treatment in an argon gas and (2b) a plasma treatment in a gas containing a nitrogen gas.

2 Claims, 1 Drawing Sheet

METHOD OF FORMING A PROTECTIVE FILM

BACKGROUND OF THE INVENTION

A. Field of the Invention

The present invention relates to a method of forming a protective film that is a component of a magnetic recording medium, and in particular to a method of forming an extremely thin protective film. The invention further relates to a protective film obtained by such a method. The invention still further relates to a magnetic recording medium including such a protective film.

B. Description of the Related Art

A magnetic recording medium is obtained generally by forming a magnetic recording layer and other layers on a substrate, and by further forming a protective film thereon. A protective film works as a slide-resistant member and/or a wear-resistant member. Various types of protective films have been disclosed.

A protective film needs to have abilities to hinder damage by contact or sliding of a magnetic head with a magnetic recording layer and to avoid corrosion of the magnetic recording layer.

One of representative protective films satisfying these requirements is a diamond-like carbon (DLC) film using carbon. A DLC film exhibits good surface smoothness and a large hardness, and thus, has a good surface covering performance that must be borne by a protective film. A DLC film is generally formed on a magnetic recording layer by means of a sputtering method, a plasma CVD method, or the like.

Meanwhile, a recording system of a magnetic recording medium has been changing from a longitudinal system to a perpendicular system, the latter being capable of higher density recording. The perpendicular system has been studied extensively for further raising the recording density. In this context, a protective film needs to be made as thin as possible while holding the performances of durability and corrosion resistance.

Several methods of forming a protective film have been disclosed. Japanese Unexamined Patent Application Publication No. 2003-303410 discloses a magnetic disk having at least a magnetic metal film, a carbon protective film, and a fluorine-containing lubrication film provided on a non-magnetic substrate. The carbon protective film consists of a diamond-like carbon film having a thickness not larger than 4 nm, and the ratio of infrared absorption intensity caused by a C—H bond to infrared absorption intensity caused by a C—F bond of the lubrication film in the vicinity of 2,920 $cm^{-1}$, as measured by a FT-IR using an ATR (attenuated total reflectance) method, is in the range of 0.035 to 0.060.

Japanese Unexamined Patent Application Publication No. 2007-265586 discloses a method of manufacturing a magnetic disk provided with a magnetic layer, a protective layer, and a lubricant layer in this order on a substrate. In this method, after the magnetic layer and the protective layer are formed in this order on the substrate, the protective layer is exposed to plasma under normal pressure and then the lubricant layer is formed on the protective layer. A plasma treatment is conducted in this particular method on a hydrogenated carbon protective layer having a thickness in the range of 0.5 to 3.0 nm formed by a plasma CVD method. The plasma treatment is carried out in at least one gas selected from a nitrogen gas, an argon gas, an oxygen gas, and a fluorine-containing hydrocarbon gas. It is asserted that the surface of the protective layer is favorably reformed and the affinity with the lubricant layer is enhanced.

These conventional techniques, however, fail in suppressing cobalt elution out of the magnetic recording layer, and hardly obtain an extremely thin protective film, specifically with a thickness not larger than 3 nm.

The present invention is directed to overcoming or at least reducing the effects of one or more of the problems set forth above.

SUMMARY OF THE INVENTION

The present invention provides a method of forming a protective film for a magnetic recording medium, the protective film suppressing cobalt elution out of the magnetic recording layer and having a thickness not larger than 3 nm. The invention further provides a protective film obtained by such a method. Still further, the invention provides a magnetic recording medium including such a protective film.

A method of forming a protective film for a magnetic recording medium of the invention comprises:

(1) a step of forming a protective film, on a lamination including a substrate and metallic film layers formed on the substrate, by means of a plasma CVD method using a raw gas of a hydrocarbon gas, wherein a flow rate of the hydrocarbon gas is in a range of 50 sccm to 200 sccm and an emission current is in a range of 0.1 to 0.3 A: and (2) a step of surface treatment on the protective film that has been formed in the step (1) including sub-steps of (2a) a plasma treatment in an argon gas and (2b) a plasma treatment in a gas containing a nitrogen gas.

The method of forming a protective film of the invention can be applied to manufacture magnetic recording media installed in various devices.

The hydrocarbon gas in the method of forming a protective film can be ethylene.

The present invention includes a protective film obtained by such a method.

The present invention further includes a magnetic recording medium comprising a substrate, metallic film layers formed on the substrate, and the protective film formed on the metallic film layers.

The method of forming a protective film according to the invention, employing special featured steps of forming a protective film and of surface treatment, suppresses cobalt elution out of the magnetic recording layer and allows a protective film for a magnetic recording medium to have a thickness not larger than 3 nm.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
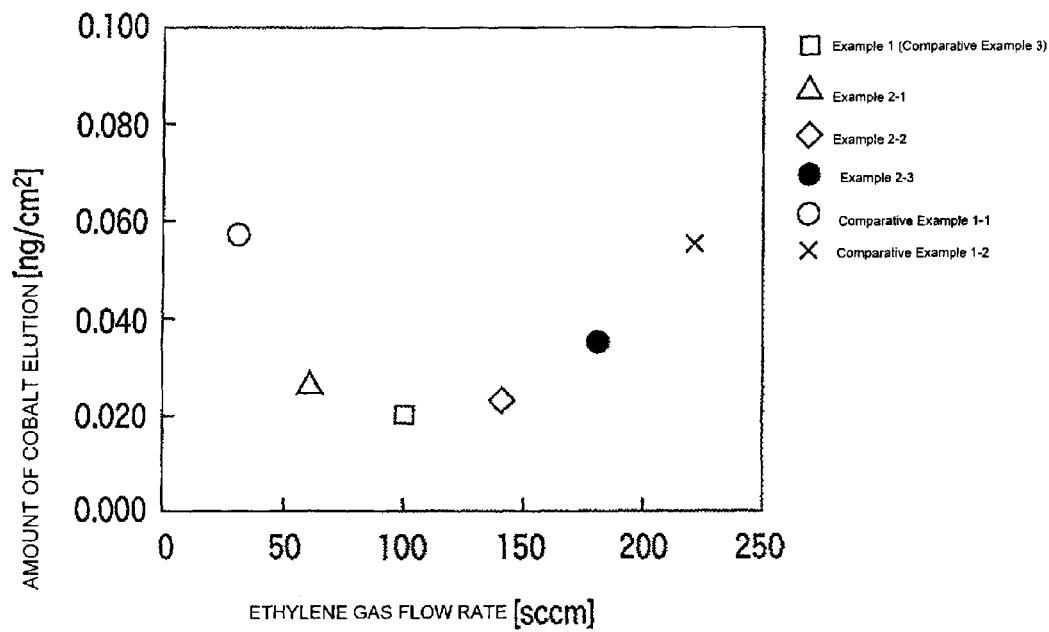
FIG. 1 is a graph showing relationship between the amount of cobalt elution and the ethylene gas flow rate.

Some preferred embodiments according to the invention will be described in detail in the following. The embodiments, however, are only illustrative examples and can be appropriately modified by a person skilled in the art.

Method of Forming a Protective Film for a Magnetic Recording Medium

The first aspect of the invention is a method of forming a protective film for a magnetic recording medium.

The method of the invention of forming a protective film for a magnetic recording medium comprises:

(1) a step of forming a protective film, on a lamination including a substrate and metallic film layers formed on the substrate, by means of a plasma CVD method using a raw gas of a hydrocarbon gas, wherein a flow rate of the hydrocarbon gas is in a range of 50 sccm to 200 sccm and an emission current is in a range of 0.1 to 0.3 A: (the step (1) is also referred to as "a first step") and (2) a step of surface treatment on the protective film that has been formed in the step (1) including sub-steps of (2a) a plasma treatment in an argon gas and (2b) a plasma treatment in a gas containing a nitrogen gas. Step (2) is also referred to as "a second step."

First Step

The first step is a step of forming a protective film, on a lamination including a substrate and metallic film layers formed on the substrate, by means of a plasma CVD method using a raw gas of a hydrocarbon gas, wherein a flow rate of the hydrocarbon gas is in a range of 50 sccm to 200 sccm and an emission current is in a range of 0.1 A to 0.3 A.

The substrate is preferably non-magnetic and can be manufactured using any materials conventionally used for manufacturing magnetic recording media, including a Ni—P plated aluminum alloy, glass, ceramics, plastics, and silicon.

Metallic film layers formed on the substrate include at least a magnetic recording layer. The metallic film layers can optionally include, between the magnetic recording layer and the substrate, a non-magnetic underlayer, a soft magnetic layer, a seed layer, and an intermediate layer.

The magnetic recording layer can be favorably formed using a ferromagnetic alloy material containing at least cobalt and platinum. An axis of easy magnetization of the ferromagnetic material needs to orient in the direction of magnetic recording. In the perpendicular magnetic recording system, for example, the axis of easy magnetization of the material of the magnetic recording layer (that is a c-axis in the hexagonal closest packed (hcp) structure) needs to orient in the direction perpendicular to the recording medium surface (that is a principal plane of the substrate).

The magnetic recording layer can be formed using an alloy material selected from CoPt, CoCrPt, CoCrPtB, and CoCrPtTa, for example. Although a thickness of the magnetic recording layer can be determined without special limitation, the thickness is preferably not larger than 30 nm, more preferably not larger than 15 nm in view of enhancing productivity and recording density.

A non-magnetic underlayer, which is optionally provided, can be formed using a non-magnetic material of titanium or a chromium-containing material such as a CrTi alloy.

A soft magnetic layer, which is optionally provided, can be formed using a crystalline material such as FeTaC or sendust (FeSiAl) alloy; a micro crystalline material such as FeTaC, CoFeNi, or CoNiP; or an amorphous material selected from cobalt-based alloys such as CoZrNd, CoZrNb, and CoTaZr. The soft magnetic layer in a perpendicular magnetic recording medium has a function of concentrating a perpendicular magnetic field generated by a magnetic head to the magnetic recording layer. A thickness of the soft magnetic layer varies in its optimum value depending on the structure and characteristics of the magnetic head used for recording, and is preferably in the range of 10 nm to 500 nm in view of balance with productivity.

A seed layer which is optionally provided, can be formed using a material selected from permalloy materials such as NiFeAl, NiFeSi, NiFeNb, NiFeB, NiFeNbB, NiFeMo, and NiFeCr; permalloy materials with an additive of cobalt such as CoNiFe, NoNiFeSi, CoNiFeB, and CoNiFeNb; cobalt; cobalt-based alloys such as CoB, CoSi, CoNi, and CoFe. The seed layer favorably has a thickness sufficient for controlling the crystal structure of the magnetic recording layer and is preferably in the range of 3 nm to 50 nm in the ordinary cases.

An intermediate layer, which is optionally provided, can be formed using ruthenium or an alloy mainly composed of ruthenium. The intermediate layer ordinarily has a thickness in the range of 0.1 nm to 20 nm. A thickness in this range gives characteristics necessary for high density recording to the magnetic recording layer avoiding degradation in magnetic properties and electromagnetic conversion characteristics of the magnetic recording layer.

Formation of the non-magnetic underlayer, the soft magnetic layer, the seed layer, the intermediate layer, and the magnetic recording layer can be carried out using any methods known in the art including sputtering methods (DC magnetron sputtering, RF magnetron sputtering and the like) and a vacuum deposition method.

The first step, step (1), forms a protective film of DLC by means of a plasma CVD method using a raw gas of a hydrocarbon gas. Suitable hydrocarbon gases includes ethylene, acetylene, methane, and benzene. A power for plasma generation can be supplied either in a capacitance-coupled scheme or an inductance-coupled scheme. A plasma generation device can be selected from a parallel plate type device, a filament type device, an ECR plasma generation device, a helicon wave plasma generation device, and the like. The supplied power can be a DC power, a HF power (at a frequency in the range of several tens to several hundreds of kHz), an RF power (at frequencies of 13.56 MHz, 27.12 MHz, and 40.68 MHz etc.) and a microwave (at a frequency of 2.45 GHz).

Deposition of the DLC film in this step can be promoted by applying a bias voltage on the lamination of substrate and metallic film layers on which the DLC film is deposited. A voltage in the range of −40 V to −120 V, for example, can be applied on the lamination.

Flow rate of the hydrocarbon gas in this step is in the range of 50 sccm to 200 sccm. A flow rate not smaller than 50 sccm has an effect that the DLC film captures a sufficient amount of hydrogen and takes a three-dimensional structure with sufficiently high density through the intervening hydrogen. A flow rate not higher than 200 sccm has an effect that the DLC film is prevented from taking a polymer-like structure and maintains a three-dimensional structure with sufficiently high density.

In addition, an emission current in this step is in the range of 0.1 A to 0.3 A. An emission current not smaller than 0.1 A has an effect that an electric current is sufficient to stabilize the plasma discharge, ensuring deposition of the DLC film. An emission current that is not larger than 0.3 A has an effect that the DLC film captures a sufficient amount of hydrogen and takes a three-dimensional structure with enough high density through the intervening hydrogen.

The first step satisfying the conditions described above makes the DLC film to have a three-dimensional structure with enough high density. Therefore, cobalt elution out of the magnetic recording layer underlying the DLC film is suppressed.

Second Step

The second step is a surface treatment step on the protective film that has been formed in the first step, step (1). The surface treatment step of the second step comprises sub-step (2a) of a plasma treatment in an argon gas and sub-step (2b) of a plasma treatment in a nitrogen-containing gas.

The surface treatment comprises sub-step (2a) argon plasma treatment and sub-step (2b) nitrogen plasma treatment, both sub-steps being preferably conducted in this order. This means that sub-step (2b) is completely separated from step (1) by sub-step (2a), which is favorable to prevent the DLC film from impairing high density property thereof.

Sub-step (2a) is a plasma treatment in an argon gas. Sub-step (2a) can be carried out using the power supply scheme, the power supply device, and the power for plasma generation that have been used in step (1). Sub-step (2a) can be conducted, for example, by substituting an argon gas for the hydrocarbon gas used in the first step in the plasma CVD device.

Sub-step (2a) is preferably conducted over a period in the range of 0.5 to 2.0 seconds. This treatment decreases hydrogen on the outermost surface of the protective film of DLC thereby suppressing adsorption of contamination gases, especially adsorption of impurities.

Sub-step (2b) is a plasma treatment in a gas containing at least nitrogen gas. Sub-step (2b) also can be carried out using the power supply scheme, the power supply device, and the power for plasma generation that have been used in the step (1). Just like in sub-step (2a), sub-step (2b) can be conducted by substituting nitrogen-containing gas for the gas used in the first step in the plasma CVD device. Alternatively, sub-step (2b) may be conducted using another separate plasma CVD device.

A gas for use in sub-step (2b) can be a pure nitrogen gas or a mixed gas of nitrogen gas and another gas. Useful another gas can be selected from inert gases such as helium, neon, and argon.

Sub-step (2b) is preferably conducted over a period in the range of 1.0 to 3.0 seconds. This treatment makes the nitrogen bond to the outermost surface of the protective film of DLC thereby forming a good binding between the protective film and a lubricant film, the latter being described afterwards.

Sub-steps (2a) and (2b) as described above simultaneously achieve suppression of adsorption of contamination gases especially impurities and good binding with the lubricant film, obtaining an extremely thin protective film.

Protective Film for a Magnetic Recording Medium

The second aspect of the present invention is a protective film for a magnetic recording medium, the protective film being formed by the method of the first aspect of the invention. A protective film of the invention is a single layer film as described above, and simultaneously achieves suppression of adsorption of contamination gases especially impurities and good binding with a lubricant film. Moreover, a protective film of the invention suppresses cobalt elution out of the magnetic recording layer and further, attains an extremely small thickness.

Magnetic Recording Medium

The third aspect of the invention is a magnetic recording medium comprising a substrate, metallic film layers formed on the substrate, and a protective film that is the protective film of the second aspect of the invention formed on the metallic film layers. A magnetic recording medium of the invention can be further provided with a lubricant film on the protective film. The lubricant film gives lubricity during contact between the magnetic recording medium and a magnetic head for read/write of records. The lubricant film can be formed of a liquid lubricant of perfluoropolyether or a lubricant selected from various liquid lubricant materials known in the art. The lubricant film can be formed by means of any coating methods known in the art such as a dip coating method, a spin coating method and the like.

A magnetic recording medium of the invention, having a protective film formed in a single layer, reduces the distance between the magnetic recording layer and the magnetic head. This feature is advantageous for enhancing recording density of the magnetic recording medium.

EXAMPLES

Effects of the present invention will be demonstrated by some preferred embodiment examples in the following. The following examples are only for illustrating the invention and should not impose any limitation on the invention.

Example 1

Formation of a Magnetic Recording Medium

First, metallic film layers of an underlayer of CoZrNb with a film thickness of 40 nm, an intermediate layer of ruthenium with a film thickness of 15 nm, and a magnetic recording layer of CoCrPt—$SiO_2$ with a thickness of 15 nm were sequentially formed on an aluminum substrate with a diameter of 95 mm and a thickness of 1.75 mm.

The resulting lamination, on which a DLC film was to be deposited, was installed in a deposition chamber of a filament type plasma CVD device. An ethylene gas was introduced into the deposition chamber at a flow rate of 40 sccm. Ethylene plasma was generated by applying a dc power at 180 V between the cathode filament and the anode to emit thermal electrons from the cathode filament. A pressure in the deposition chamber at this time was 0.53 Pa. A DLC film was deposited applying a bias voltage of −120V (relative to the ground potential) on the lamination, an object of deposition. An anode potential at this time was +60 V. Adjusting a deposition duration time, a DLC film with a film thickness of 2.5 nm was formed in the conditions of an ethylene gas flow rate of 100 sccm and an emission current of 0.25 A.

After completion of the DLC film deposition, an argon gas at a flow rate of 50 sccm was introduced substituting for the ethylene gas and an argon plasma treatment was conducted for 0.8 seconds under a pressure of 0.67 Pa.

Subsequently, the flow rate of the argon gas was changed to 10 sccm and at the same time, a nitrogen gas was introduced at a flow rate of 40 sccm. A nitrogen plasma treatment was conducted for 1.5 seconds under a pressure of 0.67 Pa, obtaining a protective film treated by the surface treatment.

Finally, a lubricant film with a thickness of 1.2 nm was formed on the protective film by applying a liquid lubricant mainly composed of perfluoropolyether by means of a dip coating method. Thus, a magnetic recording medium of Example 1 was obtained.

Example 2

Example 2-1

A magnetic recording medium of Example 2-1 was obtained in the same manner as in Example 1 except that the ethylene gas flow rate was changed to 60 sccm.

Example 2-2

A magnetic recording medium of Example 2-2 was obtained in the same manner as in Example 1 except that the ethylene gas flow rate was changed to 140 sccm.

Example 2-3

A magnetic recording medium of Example 2-3 was obtained in the same manner as in Example 1 except that the ethylene gas flow rate was changed to 180 sccm.

Example 3

A magnetic recording medium of Example 3 was obtained in the same manner as in Example 1 except that the emission current was changed to 0.15 A.

Comparative Example 1

Comparative Example 1-1

A magnetic recording medium of Comparative Example 1-1 was obtained in the same manner as in Example 1 except that the ethylene gas flow rate was changed to 30 sccm.

Comparative Example 1-2

A magnetic recording medium of Comparative Example 1-2 was obtained in the same manner as in Example 1 except that the ethylene gas flow rate was changed to 220 sccm.

Comparative Example 2

Comparative Example 2-1

A magnetic recording medium of Comparative Example 2-1 was obtained in the same manner as in Example 1 except that the emission current was changed to 0.35 A.

Comparative Example 2-2

A magnetic recording medium of Comparative Example 2-2 was obtained in the same manner as in Example 1 except that the emission current was changed to 0.45 A.

Comparative Example 3

A magnetic recording medium of Comparative Example 3 was obtained in the same manner as in Example 1 except that the protective film was not treated by the surface treatment (comprising the argon plasma treatment and the nitrogen plasma treatment).

Comparative Example 4

A magnetic recording medium of Comparative Example 4 was obtained in the same manner as in Example 1 except that the emission current was changed to 0.05 A.

Evaluation of Cobalt Elution

Cobalt elution was measured on the thus obtained magnetic recording media of Examples 1 through 3 and Comparative Examples 1 through 4 by dropping 3% aqueous solution of nitric acid and using a high frequency induction coupled plasma mass spectrometer (ICP-MS), the results of which are given in Table 1.

TABLE 1

| | | cobalt elution ($ng/cm^2$) | evaluation of elution (remark) |
|---|---|---|---|
| Example 1 | | 0.020 | good |
| Example 2 | Example 2-1 | 0.026 | good |
| | Example 2-2 | 0.023 | good |
| | Example 2-3 | 0.035 | good |
| Example 3 | | 0.011 | good |
| Comp Ex 1 | Comp Ex 1-1 | 0.057 | bad |
| | Comp Ex 1-2 | 0.055 | bad |
| Comp Ex 2 | Comp Ex 2-1 | 0.052 | bad |
| | Comp Ex 2-2 | 0.083 | bad |
| Comp Ex 3 | | 0.020 | good (bad binding with lubricant) |
| Comp Ex 4 | | — | no evaluation (deposition impossible) |

As shown in Table 1, it has been demonstrated that the magnetic recording media of Examples 1 through 3, which are within the scope of the present invention, exhibit low levels of cobalt elution. The results are caused by the phenomenon that appropriate ethylene gas flow rate and emission current in Examples 1 through 3 make the DLC film capture a favorable amount of hydrogen, forming a three-dimensional structure with high density through the intervening hydrogen.

The magnetic recording media of Comparative Examples 1 and 2, which are out of the scope of the present invention, failed to suppress the cobalt elution within low levels.

Looking at each of the Comparative Examples 1 through 4, in Comparative Example 1-1, because of a flow rate of ethylene gas that was too low, the DLC film did not take a three-dimensional structure with sufficiently high density through the intervening hydrogen. In Comparative Example 1-2, because of flow rate of ethylene gas that was too high, the DLC film took a polymer-like structure.

In Comparative Examples 2-1 and 2-2, because of excessively large emission current, the DLC film did not take a three-dimensional structure with sufficiently high density through the intervening hydrogen.

In Comparative Example 3, although the cobalt elution was suppressed to a low level, because of omission of the surface treatment on the protective film, nitrogen did not bond to the surface, failing to achieve a good binding with the lubricant layer.

In Comparative Example 4, because of extremely small value of the emission current, the electric current was insufficient, causing unstable plasma discharge and failing to deposit a DLC film.

Figure 2:
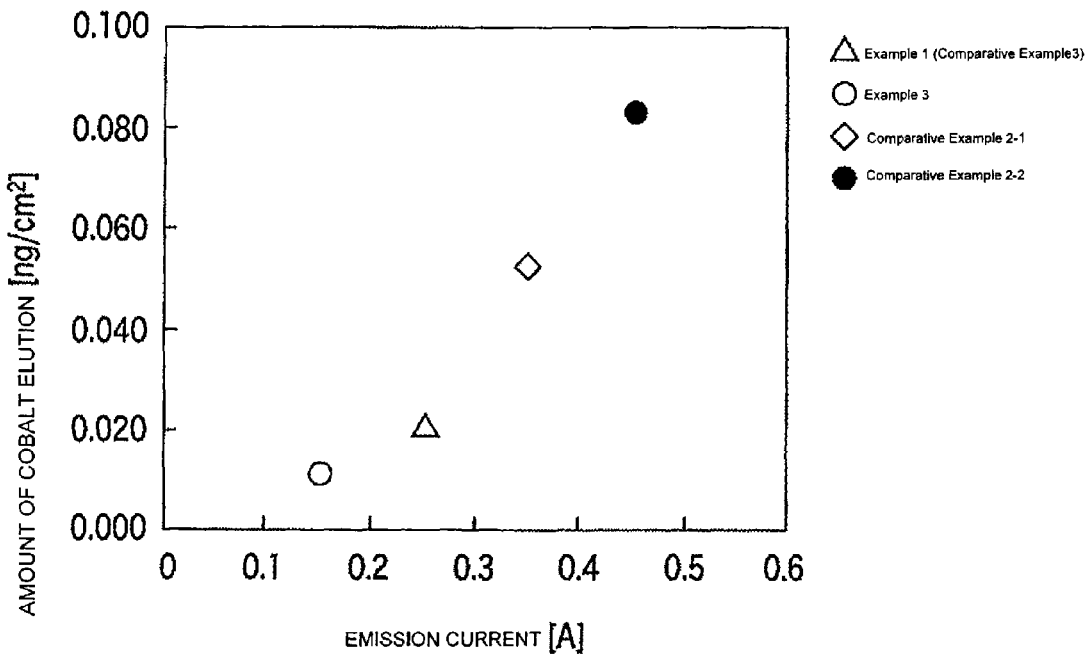
FIG. 2 is a graph showing relationship between the amount of cobalt elution and the emission current.

Concerning Examples 1 through 3 and Comparative Examples 1 through 3 (Comparative Example 4 was excluded), FIG. 1 and FIG. 2 show the dependence of the amount of cobalt elution on the ethylene gas flow rate and the dependence of the amount of cobalt elution on the emission current, respectively.

FIG. 1 shows that the cobalt elution is suppressed in low levels when the hydrocarbon gas (ethylene gas in these embodiment examples) is supplied at flow rates within the scope of the present invention, that is, in the range of 50 sccm to 200 sccm. FIG. 2 shows that the cobalt elution is suppressed to low levels when the emission current is supplied within the scope of the present invention, that is, in the range of 0.1 A to 0.3 A.

The method of forming a protective film according to the invention, employing special featured steps of forming a protective film and of surface treatment, suppresses cobalt elution out of the magnetic recording layer and allows a protec tive film for a magnetic recording medium having a thickness not larger than 3 nm. Therefore, the present invention is promising for manufacture of magnetic recording media, which continues to demand enhancement of recording density.

Thus, a magnetic recording medium including the protective film and a method for producing it have been described according to the present invention. Many modifications and variations may be made to the techniques and structures described and illustrated herein without departing from the spirit and scope of the invention. Accordingly, it should be understood that the media and methods described herein are illustrative only and are not limiting upon the scope of the invention.

This application is based on, and claims priority to, Japanese Patent Application No. 2008-325922, filed on Dec. 22, 2008. The disclosure of the priority application in its entirety, including the drawings, claims, and the specification thereof, is incorporated herein by reference.

What is claimed is:

1. A method of forming a protective film for a magnetic recording medium, the method comprising:
   (1) forming a protective film, on a lamination including a substrate and metallic film layers formed on the substrate, by means of a plasma CVD method using a hydrocarbon gas, wherein a flow rate of the hydrocarbon gas is in a range of 50 sccm to 200 sccm and an emission current is in a range of 0.1 A to 0.3 A: and
   (2) surface treating the protective film that has been formed in (1), said surface treating including
   (2a) a plasma treatment in an argon gas, and
   (2b) a plasma treatment in a gas containing a nitrogen gas wherein 2a precedes 2b.

2. The method of forming a protective film for a magnetic recording medium according to claim 1, wherein the hydrocarbon gas is ethylene.

* * * * *